United States Patent
Korhonen

(10) Patent No.: US 7,155,645 B1
(45) Date of Patent: *Dec. 26, 2006

(54) SYSTEM AND METHOD FOR TESTING MEMORY WHILE AN OPERATING SYSTEM IS ACTIVE

(75) Inventor: Aki Korhonen, Davis, CA (US)

(73) Assignee: PC-Doctor, Inc., Reno, NV (US)

( * ) Notice: Subject to any disclaimer, the term of this patent is extended or adjusted under 35 U.S.C. 154(b) by 298 days.

This patent is subject to a terminal disclaimer.

(21) Appl. No.: 10/853,788

(22) Filed: May 24, 2004

Related U.S. Application Data

(63) Continuation of application No. 09/800,119, filed on Mar. 5, 2001, now Pat. No. 6,742,148.

(60) Provisional application No. 60/187,183, filed on Mar. 6, 2000.

(51) Int. Cl.
   *G06F 11/00* (2006.01)
   *G11C 29/00* (2006.01)
   *G11C 7/00* (2006.01)
   *H04L 9/00* (2006.01)

(52) U.S. Cl. ................ 714/718; 365/201; 711/134

(58) Field of Classification Search ............ None
   See application file for complete search history.

(56) References Cited

U.S. PATENT DOCUMENTS

| | | | |
|---|---|---|---|
| 5,239,635 A | 8/1993 | Stewart et al. | |
| 5,299,202 A | 3/1994 | Vaillancourt | |
| 5,396,619 A | 3/1995 | Walton | |
| 5,559,980 A | 9/1996 | Connors et al. | |
| 5,627,995 A | 5/1997 | Miller et al. | |
| 5,784,699 A * | 7/1998 | McMahon et al. | 711/171 |
| 5,812,472 A | 9/1998 | Lawrence et al. | |
| 5,881,221 A | 3/1999 | Hoang et al. | |
| 6,081,817 A | 6/2000 | Taguchi | |
| 6,085,296 A | 7/2000 | Karkhanis et al. | |
| 6,088,758 A | 7/2000 | Kaufman et al. | |
| 6,092,168 A * | 7/2000 | Voigt | 711/170 |
| 6,202,134 B1 | 3/2001 | Shirai | |
| 6,233,668 B1 | 5/2001 | Harvey et al. | |
| 6,311,290 B1 | 10/2001 | Hasbun et al. | |
| 6,640,290 B1 * | 10/2003 | Forin et al. | 711/156 |
| 6,742,148 B1 | 5/2004 | Korhonen | |

\* cited by examiner

*Primary Examiner*—Phung My Chung
(74) *Attorney, Agent, or Firm*—Fliesler Meyer, LLP

(57) ABSTRACT

A system for testing a memory page of a computer while an operating system is active. The system includes a hook function and a pattern generator. The hook function has software instructions that takes the place of a memory allocation/release scheme of the operating system. The system stores a test pattern generated by the pattern generator in the memory page upon receiving a request to release the memory page. Upon receiving a request to allocate the memory page, the system verifies the test pattern is correct to ensure the memory page is not defective. If the test pattern is incorrect, the defective memory page is removed from service.

10 Claims, 2 Drawing Sheets

SYSTEM AND METHOD FOR TESTING MEMORY WHILE AN OPERATING SYSTEM IS ACTIVE

CROSS-REFERENCE TO RELATED APPLICATIONS

The present application is a continuation application of U.S. patent application Ser. No. 09/800,119, filed Mar. 5, 2001, now U.S. Pat. No. 6,742,148, entitled "Testing a System Memory While an Operating System is Active" which in turn, claims priority from U.S. Provisional Patent Application No. 60/187,183, filed Mar. 6, 2000, entitled "Testing a System Memory While an Operating System is Active".

BACKGROUND OF THE INVENTION

The present invention relates generally to the field of testing computer system components, and more specifically, to a system and method for testing memory in a computer system while an operating system is active.

Conventional schemes for performing diagnostic tests on computer memory systems are well known. The importance of testing a computer's memory cannot be overemphasized. Costs and defects associated with memory defects are relatively high due to user downtime and loss of information. Many software applications are memory intensive and it is important to ensure that defective memory which impacts the performance of such software applications are detected and removed.

While most software applications are stored on the hard disk, an application must be loaded into memory first in order to execute the application. Initially, the operating system assigns a memory block (e.g. 64 kb) for the application. The operating system then copies the application from the hard disk to the allocated memory block. The application is thereafter executed within the allocated memory. While the application is active, it may require more memory blocks, which it will allocate from the operating system by calling a memory allocation routine that is part of the operating system; and from time to time the application releases the memory blocks thus allocated using a memory deallocation routine that is part of the operating system. Thereafter, upon completion of the application, the operating system relinquishes the memory block that it initially allocated for the application, and any memory blocks that the application might have allocated while it was active, for use by other applications. This allocation/deallocation of memory is constantly occurring within the computer system.

Operating systems typically allocate memory at two levels. At a lower level the operating system allocates physical memory, while virtual memory is allocated at a higher level. Further, in today's faster and efficient processors, operating systems are capable of multitasking and can execute multiple programs simultaneously. This results in increased memory requirements which are typically more than the available amount of physical memory. Consequently, virtual memory is employed to ensure that adequate memory is available. Virtual memory is a memory allocation scheme in which a computer with a lesser amount of physical memory appears as if it had a much higher amount of memory. Typically, when applications allocate memory, the operating system automatically allocates virtual memory. When an application starts to read or write to virtual memory, the operating system and the CPU detect the read or write operation and automatically verify if physical memory has been allocated to the virtual memory address that the application is accessing, and if not, the operating system allocates physical memory to the virtual memory address that is being accessed. Although an application may be allocated a large amount of virtual memory with a large number of virtual memory addresses, those addresses are mapped to physical memory only as needed. Allocation of physical memory is done in an allocation unit known as pages. The size of a physical memory page can vary with the capabilities of the CPU. In this manner, the memory allocation/deallocation routine of the operating system ensures that large memory requirements for software applications are met.

As noted, conventional schemes for performing diagnostic tests on memory in a computer system are well known. One example of such a scheme is a POST (power on self test) computer program embedded in system memory. Because POST executes every time a computer is booted on, there is a desire to minimize the time that a user has to spend waiting for the computer to boot. Therefore, POST runs quick diagnostic tests on the computer memory as well as other system components. Rather than limit testing to system memory, POST typically tests all of the components within the computer system. Moreover, the sophistication of POST is limited in order to effectively reduce the booting period when the computer system is turned on. In any event, POST is limited to the booting process and failures occurring while the operating system is active are not detected.

Other schemes include various diagnostic programs typically stored on media such as the computer's hard disk drive or floppy disk. Such diagnostic programs are commercially available for purchase by users, and are employed to detect faults related to computer components, such as memory, video, optical storage, hard disk drive, serial ports and virtual memory. In some instances, the user can select which components on which diagnostic programs should be performed. Typically, diagnostics programs test memory by writing specific data patterns to memory and then reading back these patterns for verification. That is, a deviation from the expected data pattern indicates the portion of memory as being defective.

Disadvantageously, if processes are running which occupy portions of system memory, many diagnostic programs cannot test the occupied portions. Attempts to access these portions of memory will result in a system crash. Further, diagnostic programs are typically complicated and cannot be run by a computer novice.

Another disadvantage relates to the length and complexity of diagnostic programs which have significant processor performance and memory requirements. In addition, many diagnostic programs will have a significant impact on system performance, and thus it is not advantageous to run these diagnostic programs in anticipation of failures, but rather only after it appears that a failure has occurred and only the exact cause of the failure remains to be determined.

Further, the accuracy of the results of some diagnostic programs are somewhat doubtful because the diagnostic programs when executed do not simulate the full range of operating environments in which the computers are employed. A further disadvantage of such diagnostic programs is that memory failures are not automatically detected. In fact, by the time a system failure occurs, data loss has already taken place and it is almost always too late to manually execute a diagnostic program to prevent loss of valuable information.

Moreover, computers traditionally rely on hardware components such as parity error checking and Error Checking and Correcting (ECC) mechanisms to monitor system memory for errors while the system is running. These solutions increase system cost, as they require extra hardware components, and extra memory to store error detection information.

Therefore, it would be desireable to provide a system and method which is capable of resolving the aforementioned problems relating to the conventional approaches for performing diagnostic tests on system memory.

SUMMARY OF THE INVENTION

The present invention generally integrates memory testing at the operating system level to make memory testing a continuous background task. In a first embodiment, memory is tested when it gets deallocated by placing a test pattern in the memory. The accuracy of the test pattern is verified when the memory is required by another software application. In an alternate embodiment, the present invention discloses a method using a test pattern for testing a memory page of a computer system while an operating system is active.

The method comprises the steps of determining a function for allocating the memory page used by the operating system, and hooking the function for allocating the memory page. Upon receiving a request to allocate the memory page, the method involves determining whether the memory page has the test pattern; and if the memory page has the test pattern, verifying the test pattern is correct to ensure the memory page is not defective. If the test pattern is correct, the memory page is allocated as requested, and if the test pattern is incorrect, the memory page is removed from service.

In a further embodiment, the present invention teaches a method using a test pattern for testing a memory page while an operating system is active. The method comprises the steps of determining a deallocation scheme for deallocating the memory page by the operating system, hooking the deallocation scheme for deallocating the memory page; and upon receiving a request to deallocate the memory page, storing the test pattern in the memory page.

In addition, one aspect of the present invention teaches a system for testing a memory page of a computer while an operating system is active. The system includes software code having, one or more software instructions that takes the place of a memory allocation/release scheme of the operating system, and having one or more software instructions for storing a test pattern in the memory page upon receiving a request to release the memory page.

In a further aspect, the software code includes one or more software instructions for determining whether the memory page has the test pattern upon receiving a request to allocate the memory page, and one or more software instructions for verifying the test pattern is correct to ensure the memory page is not defective. If the test pattern is correct, the code includes one or more software instructions for allocating the memory page as requested, and if the test pattern is incorrect, for removing the memory page from service.

A further embodiment of the present invention discloses a system for testing a memory page of a computer system while an operating system is active. The system includes a means for determining a deallocation scheme for deallocating the memory page by the operating system; a means for hooking the deallocation scheme for deallocating the memory page; and upon receiving a request to deallocate the memory page, a means for storing the test pattern in the memory page.

In an alternate aspect, the system includes a means for determining a function used by the operating system for allocating the memory page upon receiving a request to allocate the memory page; a means for hooking the function for allocating the memory page; and a means for verifying the test pattern is correct to ensure the memory page is not defective, if the test pattern is correct, means for allocating the memory page as requested, if the test pattern is incorrect, means for removing the memory page from service.

Advantageously, unlike the related art, the present invention makes memory testing a continuous background task, automatically and accurately detects memory failure and ultimately reduces user down time.

Figure 1:
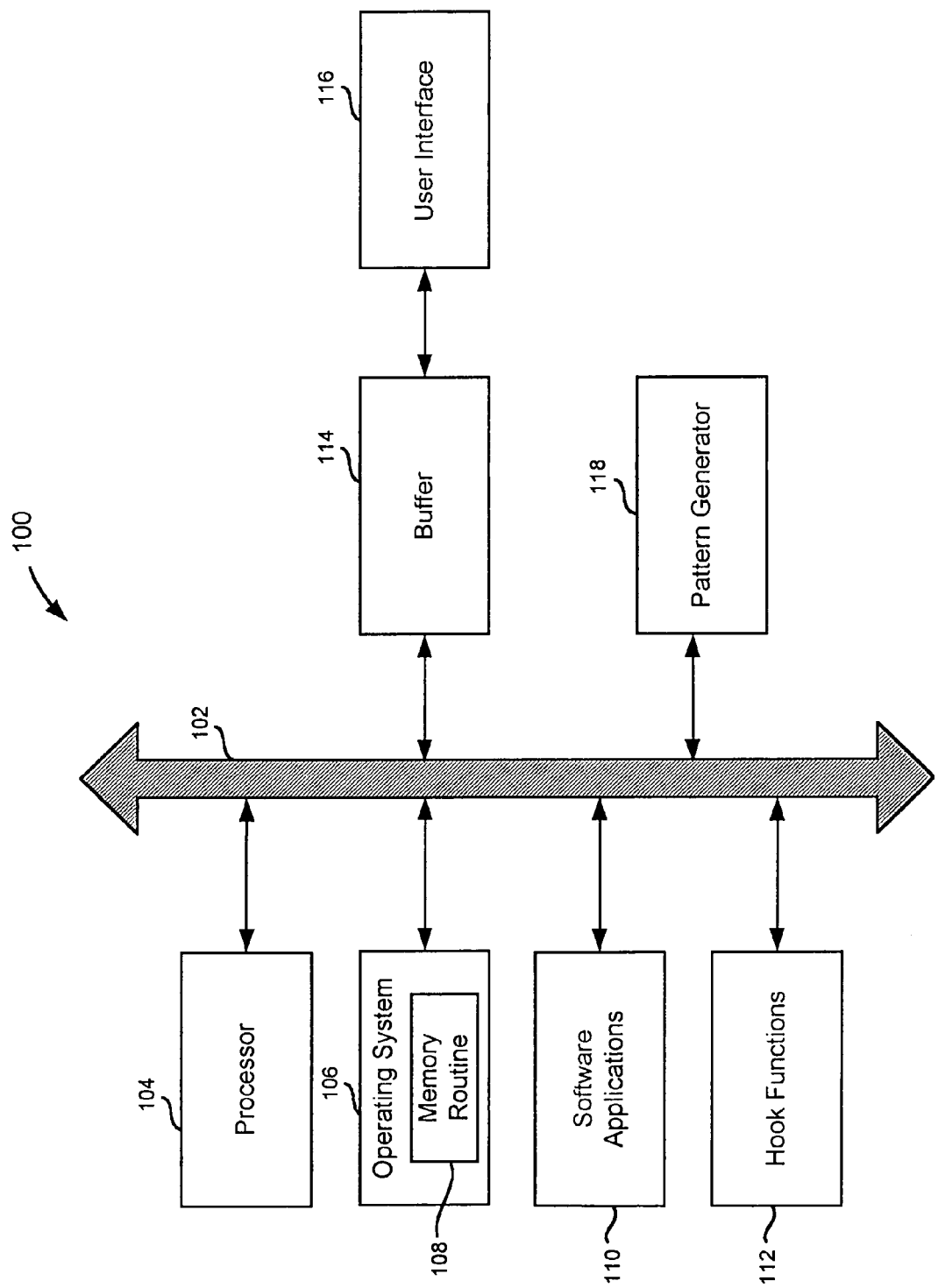
FIG. 1 is an exemplary block diagram of a computer system for enabling memory testing in accordance with a first embodiment of the present invention.

A further understanding of the nature and advantages of the present invention herein may be realized by reference to the remaining portions of the specification and the attached drawings. Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DETAILED DESCRIPTION OF THE INVENTION

Generally, the present invention integrates memory testing at the operating system level to make memory testing a continuous background task. In one embodiment, memory is tested when it gets deallocated by placing a test pattern in the memory. The test pattern is verified when the memory is required by another software application.

FIG. 1 is an exemplary block diagram of a computer system 100 for enabling memory testing in accordance with a first embodiment of the present invention. In FIG. 1, computer system 100 comprises a processor 104 for controlling operations within the computer system 100, an operating system 106 having a memory routine 108 for allocating/deallocating memory to software applications, a bus 102 for forwarding signals between system components, a plurality of software applications 110, a user interface 116 coupled to a buffer 114 initiating the software applications 110, one or more hook functions 112 for hooking memory routine 108, and a pattern generator 118 that generates test patterns for testing selected memory pages.

In operation, a test program (not shown) designed to test system memory (not shown) within computer system 100 begins by installing one or more hook functions 112. Installing the hook function 112 allows the test program to gain access to memory allocation/deallocation requests. More specifically, processor 104 in conjunction with operating system 106 hooks memory routine 108, that is, memory routine 108 is replaced with hook function 112.

Thereafter, hook function 112 is automatically initiated when memory allocation/deallocation requests to allocate or deallocate physical memory (not shown) are made. The user may be given control over the test program using the user interface 116 or when the computer system 100 is booted up. One of ordinary skill in the art will realize that other techniques for temporarily obtaining access to memory allocation/deallocation requests are possible. Alternatively, for example, the hooking functions 112 may cooperate with the memory routine 108 to gain access to the memory allocation/deallocation requests (rather than replacing the memory routines 108 entirely). Hook function 112 may be a driver (software), hardware or a combination of both.

Upon initiating one or more software applications 110, a memory allocation request may be generated to request a memory page. Before passing the memory allocation request to the operating system 106, hook functions 112 check whether the requested memory page was marked with a test pattern. If so, hook function 112 verifies the test pattern after which the requested memory page is allocated to software application 110.

Similarly, when a memory deallocation request is requested, hook function 112 calls operating system 106 to deallocate the requested memory page. Thereafter, pattern generator 118 generates a test pattern which is to be stored in the deallocated memory page.

In one exemplary mode, a test pattern that combines the physical memory address with static test patterns, forming dynamic test data that is more likely to catch cross-linked memory, signal skew and bus noise is stored.

In a second exemplary mode, a collection of alternating static patterns, which are not dynamic are stored. It should be observed that either of these modes is selectable by the user. Therefore, the test pattern may be static or dynamic. In this fashion, the present invention implements runtime memory testing while the operating system is active, wherein memory is marked with a test pattern when deallocated, and tested prior to allocation.

Figure 2:
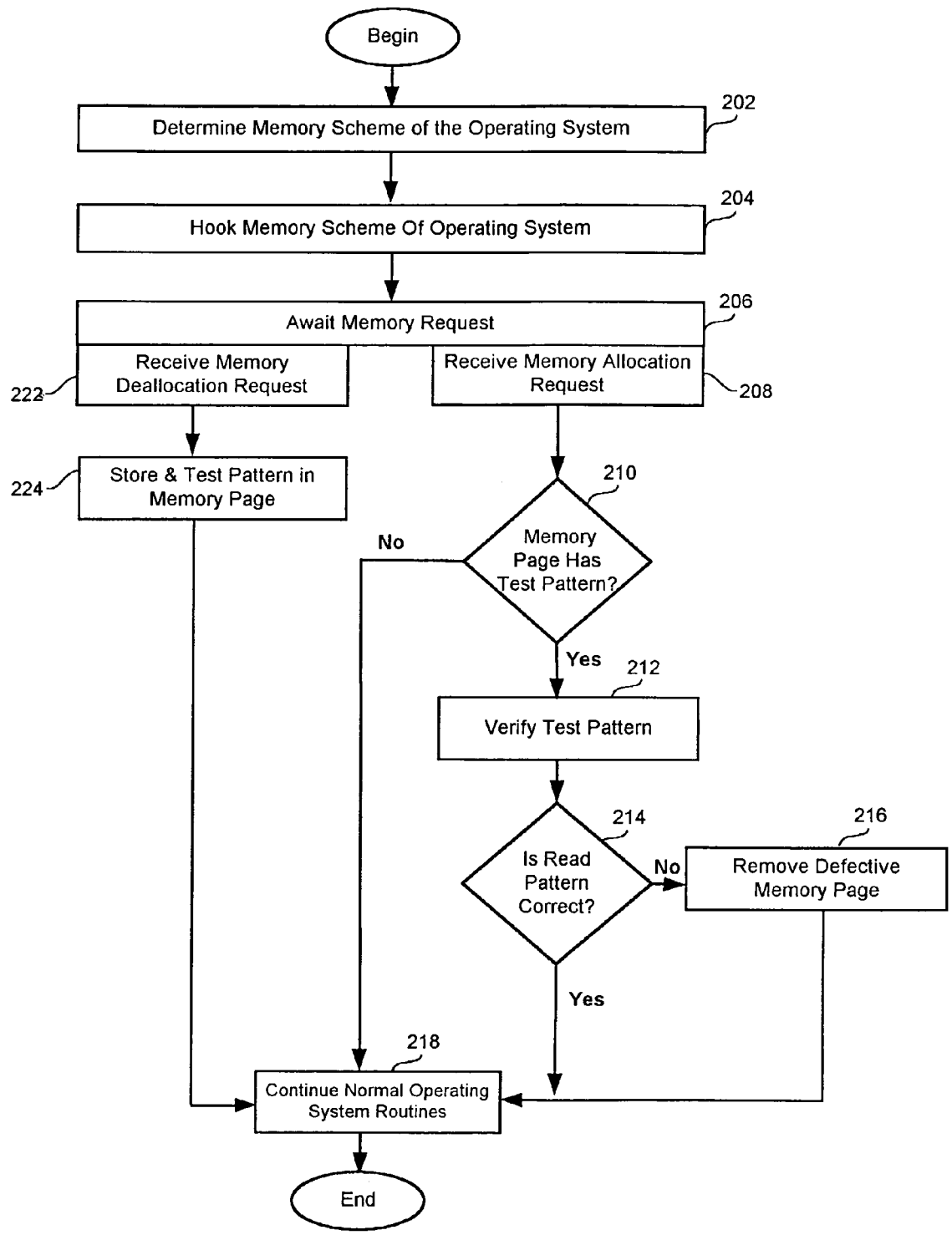
FIG. 2 is an exemplary flow chart for testing a physical memory page in accordance with a first embodiment of the present invention.

FIG. 2 is an exemplary flow chart illustrating a method for testing a physical memory page in accordance with a first embodiment of the present invention. The present embodiment employs a test pattern which may be a series of psuedorandom numbers for testing a memory page while operating system 106 is active.

In FIG. 2, at block 202, the initialization of hook function 112 begins. This involves determining a function used by operating system 106 for allocating memory pages. That is, the method and routines encompassed by memory routine 108 are determined.

At block 204, memory routine 108 is hooked. That is, memory routine 108 is replaced by hook function 112. Hook function 112 is then able to gain access to any memory allocation/deallocation requests issued by the computer system 100.

At block 206, the computer system 100 awaits a request for memory allocation or deallocation.

At block 208, a memory allocation request is received requesting allocation of a memory page.

At decision block 210, upon receiving the request to allocate the memory page, it is determined whether the memory page has been marked with the test pattern. If the memory page has been marked with the test pattern, the test pattern is verified. As will be explained below, a test pattern is stored in a memory page during deallocation. A copy of the stored test pattern for the specific memory page is maintained by the test program for subsquent verification purposes.

At block 212, the test pattern is verified to be correct to ensure the memory page is nor defective.

At decision block 214, if the test pattern is correct, the memory page is thereafter allocated as requested, and normal operating system routines continue as shown at block 218.

At block 216, if the test pattern is incorrect, the memory page is considered defective and is removed from service. Thereafter, normal operating system routines continue as shown at block 218.

At decision block 210, if the memory page has not been marked with the test pattern, normal operating system routines continue as shown at block 218. It should be observed that after the test program hooks the memory routines 108, it can also choose to place the test pattern in all unused memory pages in anticipation of them being allocated at a future time.

At block 222, a request to deallocate (release) the memory page is received.

At block 224, the test pattern is stored in the deallocated memory page after which normal operating system routines continue as shown at block 218. A copy of the test pattern is maintained the test program to allow subsequent verification when a memory allocation request for the same memory page is detected.

In this manner, the present invention provides a system for testing memory while the operating system is active. Unlike the related art, one embodiment of the present invention enables runtime memory testing wherein memory testing is a continuous background task so that physical memory is tested prior to its allocation to an application. It should be observed that although the invention has been described with regard to memory testing at the physical page level, one of ordinary skill in the art will realize that other levels of testing may be implemented.

While the above is a complete description of exemplary specific embodiments of the invention, additional embodiments are also possible. Thus, the above description should not be taken as limiting the scope of the invention, which is defined by the appended claims along with their full scope of equivalents.

What is claimed is:

1. A method for testing a memory page of a computer system with a generated test pattern while an operating system is active, comprising:
    detecting a memory allocation/deallocation request for said memory page;
    determining whether said memory allocation/deallocation request is for allocation or deallocation of said memory page;
    if allocation of said memory page is requested, verifying said generated test pattern with a test pattern, if any, stored in said memory page; and
    if deallocation of said memory page is requested, storing said generated test pattern in said memory page.

2. The method according to claim 1, further comprising:
    if said generated test pattern does not match said test pattern stored in said memory page, indicating said memory page as defective.

3. A method using a test pattern for testing a memory page of a computer system while an operating system is active, the method comprising:
    determining a function for allocating the memory page used by the operating system;
    hooking the function for allocating the memory page;
    upon receiving a request to allocate the memory page, determining whether the memory page has the test pattern; and if the memory page has the test pattern, verifying the test pattern is correct to ensure the memory page is not defective, if the test pattern is correct, allocating the memory page as requested, if the test pattern is incorrect, removing the memory page from service.

4. The method of claim 1 wherein the step of hooking the function is by replacing the function for allocating the memory page.

5. The method of claim 1 wherein the step of hooking the function is by installing a module to access the function for allocating the memory page.

6. The method of claim 1 wherein the test pattern is dynamic.

7. The method of claim 1 wherein the test pattern is static.

8. The method of claim 1 wherein the test pattern is both dynamic and static.

9. A method using a test pattern for testing a memory page while an operating system is active, the method comprising:

determining a deallocation scheme for deallocating the memory page by the operating system;

hooking the deallocation scheme for deallocating the memory page; and upon receiving a request to deallocate the memory page, storing the test pattern in the memory page.

10. The method of claim 9, upon receiving a request for allocating the memory page, further comprising;

determining a function used by the operating system for allocating the memory page;

hooking the function for allocating the memory page; and verifying the test pattern is correct to ensure the memory page is not defective, if the test pattern is correct, allocating the memory page as requested, if the test pattern is incorrect, removing the memory page from service.

* * * * *